United States Patent [19]

Kurosawa et al.

[11] Patent Number: 5,699,541
[45] Date of Patent: Dec. 16, 1997

[54] MEMORY SYSTEM USING SCHOTTKY DIODES TO REDUCE LOAD CAPACITANCE

[75] Inventors: Kenichi Kurosawa; Shin Kokura, both of Hitachi; Michio Morioka, Ebina; Tetsuaki Nakamikawa, Hitachi; Sakou Ishikawa, Hadano, all of Japan

[73] Assignee: Hitachi, Ltd., Tokyo, Japan

[21] Appl. No.: 406,147

[22] Filed: Mar. 20, 1995

[30] Foreign Application Priority Data

Mar. 18, 1994 [JP] Japan ................. 6-048238

[51] Int. Cl.⁶ ................. G06F 12/00; G06F 12/02; G06F 9/26; G06F 9/32
[52] U.S. Cl. ................. 395/405; 395/287; 395/309; 395/298; 257/480; 326/30
[58] Field of Search ................. 395/405, 427, 395/401, 287, 309, 298; 365/207; 375/257; 326/30; 257/480

[56] References Cited

U.S. PATENT DOCUMENTS 5,132,564  7/1992  Fletcher et al. ................. 365/30
5,323,349  6/1994  Hamade et al. ................. 365/207
5,448,591  9/1995  Goodrich ................. 357/257

*Primary Examiner*—David K. Moore
*Assistant Examiner*—Than V. Nguyen
*Attorney, Agent, or Firm*—Evenson McKeown Edwards & Lenahan, PLLC

[57] ABSTRACT

A computer memory system is disclosed with an input/output circuitry capable of separating the load separating the load capacitance of an output circuit of a semiconductor memory connected to a memory bus from the memory bus. In order to separate the load capacitance of a semiconductor memory connected to a memory bus signal line, a Schottky diode is arranged between the semiconductor memory and the memory bus line, and a voltage control circuit is provided to control whether a reverse bias voltage is applied to the Schottky diode. The speed of signal transmission does not decrease even when a large number of semiconductor memories are connected to the memory bus since the load capacitance of the semiconductor memories is separated from the bus. Therefore, it is possible to construct a high speed and large capacity memory system.

19 Claims, 10 Drawing Sheets

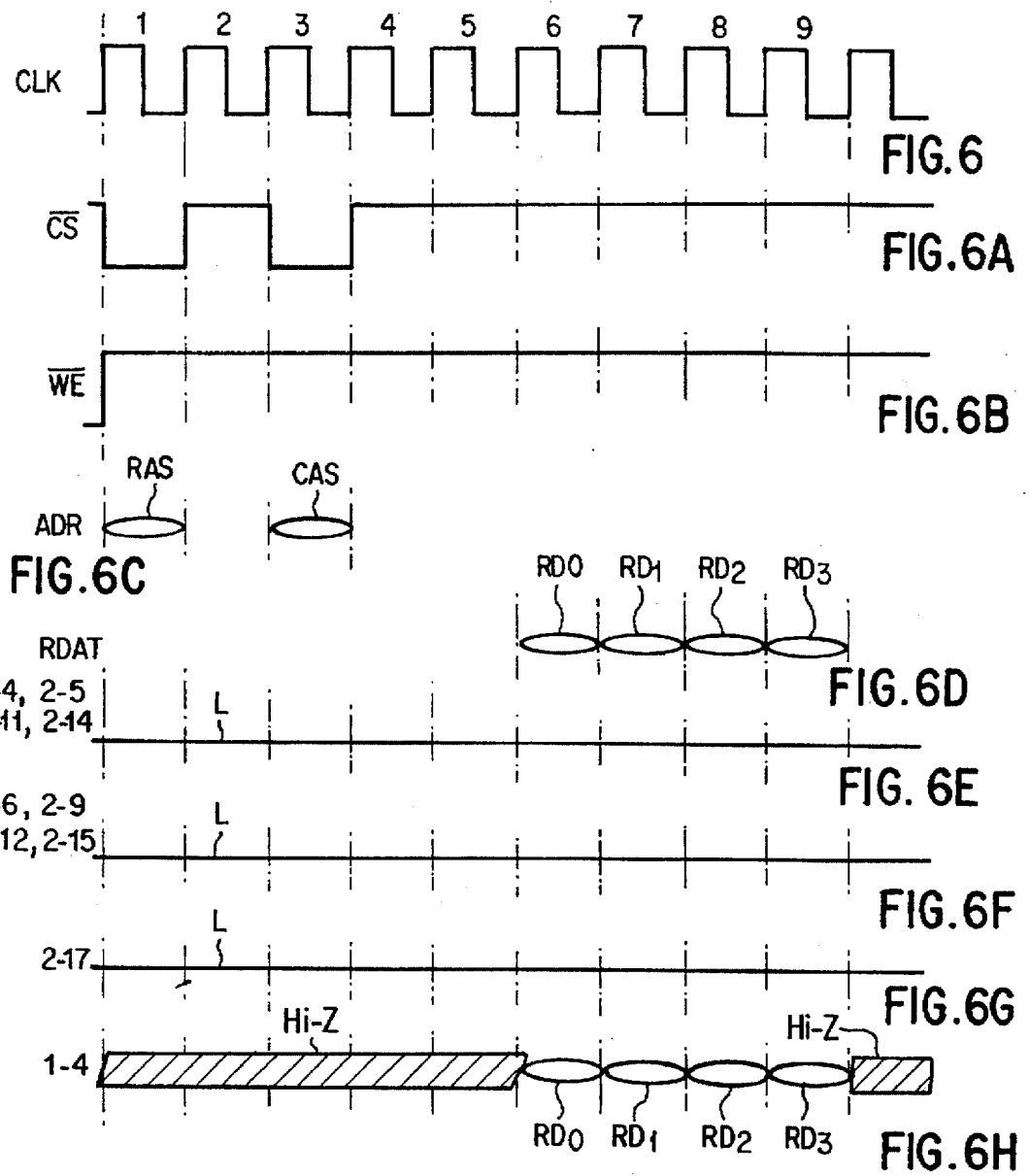

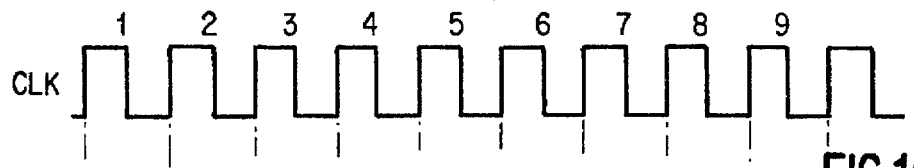
FIG. 10
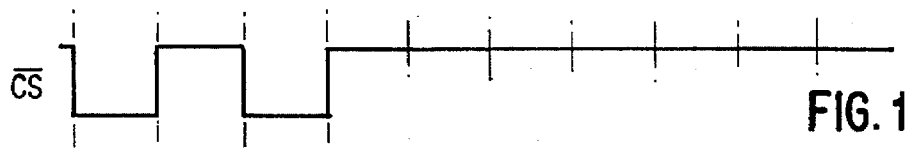
FIG. 10A
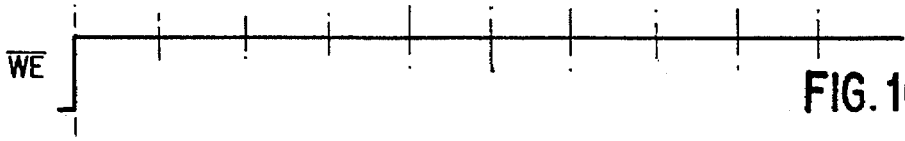
FIG. 10B
FIG. 10C
FIG. 10D
FIG. 10E
FIG. 10F
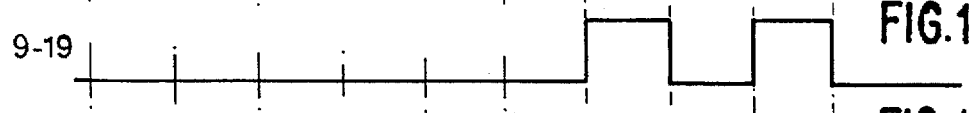
FIG. 10G
FIG. 10H
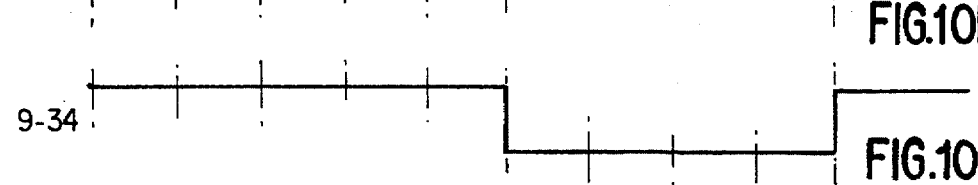
FIG. 10I
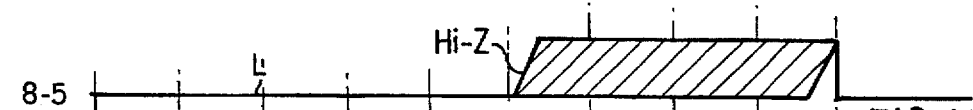
FIG. 10J
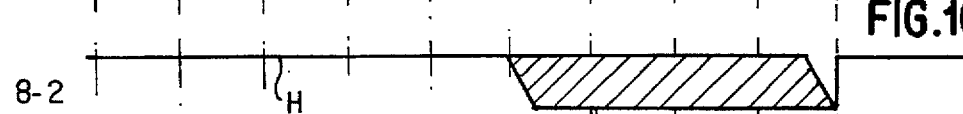
FIG. 10K

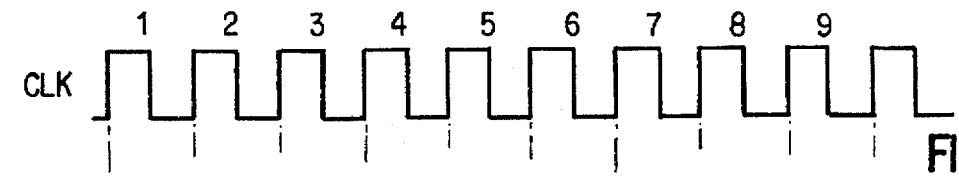
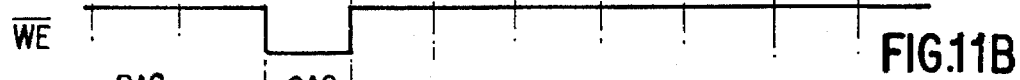
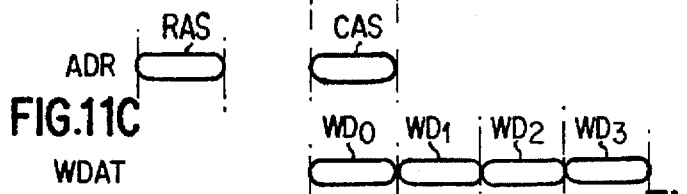
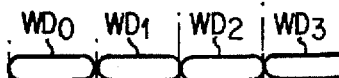
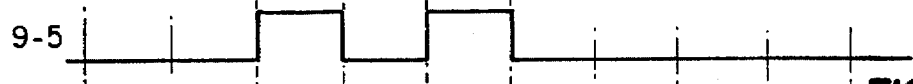
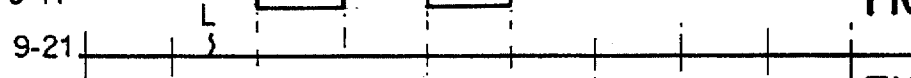
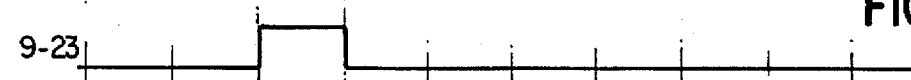
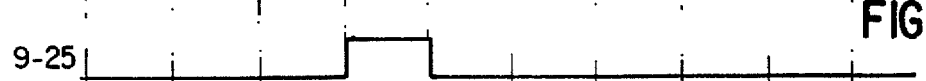
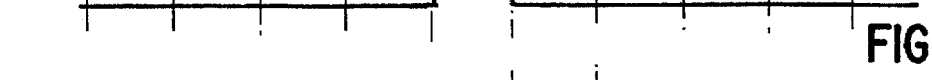
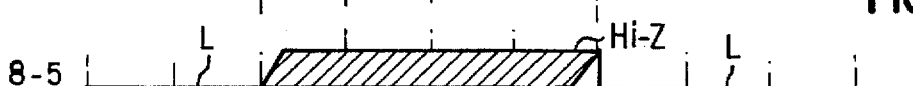
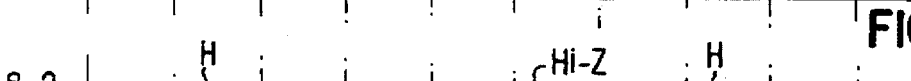

MEMORY SYSTEM USING SCHOTTKY DIODES TO REDUCE LOAD CAPACITANCE

BACKGROUND OF THE INVENTION

The present invention relates to a memory system used in a computer or the like, and more particularly to a memory system which is accessible with a high speed even when a large number of semiconductor memories are connected to its bus line.

DESCRIPTION OF THE RELATED ART

A conventional memory system has been a strong limitation in the number of semiconductor memories allowed to be connected to a single line of memory bus wiring. For example, in a case where ten semiconductor memories are arranged on a single line of memory bus wiring with a spacing of several centimeters through connectors, the memory bus wiring has a total load capacitance of 100 pF since the load capacitance of the input/output circuit in the semiconductor memory is approximately 7 pF and the load capacitance of the connector is approximately 3 pF. Realization of high-speed access for the memory capacity thus is limited since the speed of signal transmission on the memory bus wiring decreases as the load capacitance increases.

There is prior art disclosing a method where the load capacitance of an output circuit of a semiconductor integrated circuit is separated from bus wiring by inserting a Schottky diode between the output circuit and the bus wiring. The related technology is described in U.S. Pat. No. 5,132,564.

In the conventional technology, there is a disadvantage in that it is impossible substantially to improve the speed of signal transmission since the load capacitance of an input circuit in the semiconductor integrated circuit is not isolated from the bus wiring. As described above, there is a disadvantage in that the more semiconductor memories are connected on memory bus wiring, the slower the speed of signal transmission becomes due to the load capacitance of the semiconductor memories, thereby limiting the improvement in operating frequency of the memory system.

SUMMARY OF THE INVENTION

An object of the present invention is to provide an improved high speed memory system. In order to attain this object, according to the present invention, there is provided a memory system having respective memories containing respective signal input/output circuits and bus wiring connected to said signal input/output circuits, which comprises load capacitance separating means for selectively separating the load capacitance of said signal input/output circuits from said bus wiring.

More specifically, in especially preferred embodiments, a Schottky diode and a voltage control circuit for controlling a reverse bias voltage thereto are inserted between the respective semiconductor memories and the memory bus wiring.

The features of the present invention described above and others will be described below in more detail. The present invention provides an input/output controlling method for separating not only the load capacitance of an output circuit of a semiconductor memory connected to bus wiring but also the load capacitance of an input circuit from the memory bus line. By doing so, a large number of semiconductor memories can be connected to the memory bus wiring and the operating frequency of the memory system can be substantially increased.

BRIEF DESCRIPTION OF THE DRAWINGS

FIGS. 6-6H are timing charts of the voltage control circuit for memory read in the first embodiment in accordance with the present invention;

FIGS. 10-10K are timing charts of the voltage control circuit for memory read in the second embodiment in accordance with the present invention;

FIGS. 11-11N are timing charts of the voltage control circuit for memory write in the second embodiment in accordance with the present invention;

DETAILED DESCRIPTION OF THE PREFERRED EMBODIMENTS

Figure 4:
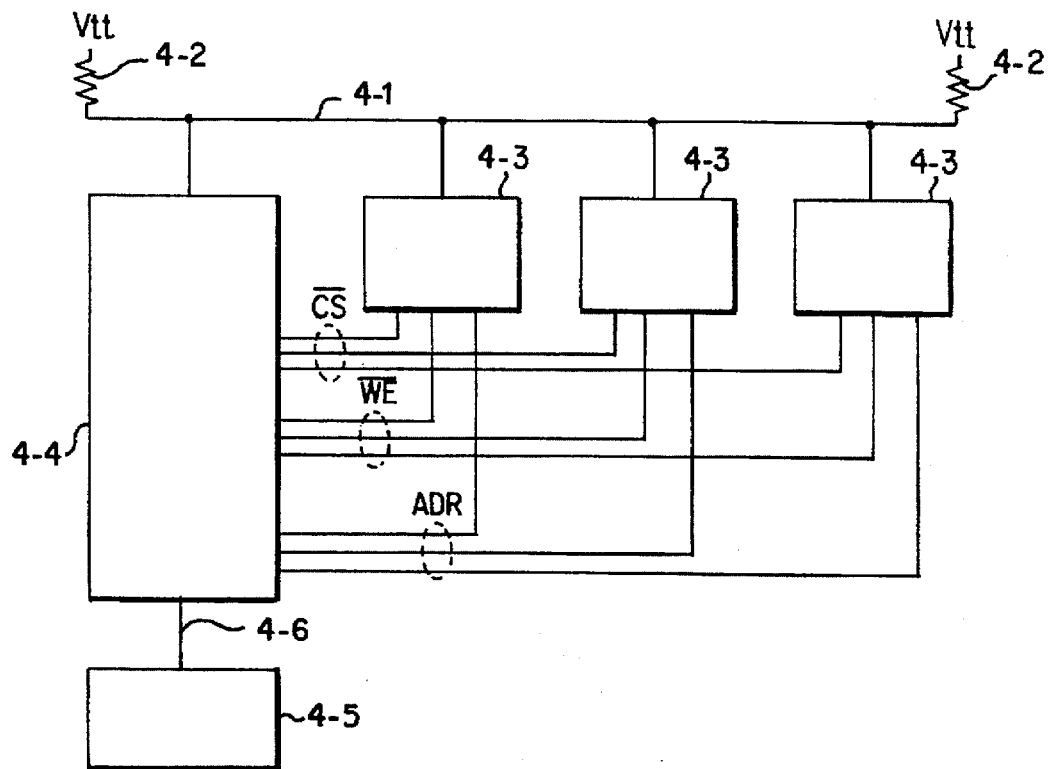
FIG. 4 is a circuit diagram showing the whole structure of a memory system constructed in accordance with the present invention.

The entire construction of a memory system needed to explain the present invention will be described below, referring to FIG. 4. A memory bus 4-1 terminates at its ends with a voltage Vtt and a resistance 4-2. Synchronous DRAMs (synchronous dynamic random access memory) each have a load reducing circuit described below. A memory controller 4-4 is provided, and a processor 4-5 is connected to the memory controller 4-4 through a processor bus 4-6. Control signals, including chip select signal CS, write enable signal WE, and memory address signal ADR are connected between the respective synchronous DRAMs 4-3 having the load reducing circuits and the memory controller 4-4. On the other hand, the memory bus 4-1 is a signal line which transmits data between the memory controller 4-4 and each of the synchronous DRAMs 4-3.

An operation where the processor reads memory data will be described below.

The processor 4-5 puts out a memory address to be read to the processor bus 4-6 with a cache miss or the like inside the processor. The memory controller 4-4 selects one of the synchronous DRAM's based on the received address to transmit a chip select signal CS, and a write enable signal WE and a memory address ADR to the selected synchronous DRAM. On the other hand, the selected synchronous DRAM reads data from the memory with a certain timing delay after receiving the above signal to put out the data to the memory bus 4-1. The memory controller 4-4 also latches the data on the memory bus based on a certain timing delay and a check such as ECC (error correcting code) and the like to transmit the data to the processor 4-5 through the processor bus 4-6. By this operation, the processor 4-5 can execute processing with receiving necessary data.

An operation where the processor writes data in the memory will be described below. The operation is similar to the case of reading memory data. The processor 4-5 puts out data and a memory address to be written to the processor bus 4-6 with a cache miss or the like inside the processor. The memory controller 4-4 adds a redundant code such as ECC to the received data and selects one of the synchronous DRAM's from the existing plural synchronous DRAM's based on the received address to transmit a chip select signal CS, a write enable signal WE, a memory address ADR and the write data to the selected synchronous DRAM. On the other hand, the selected synchronous DRAM writes the data on the memory bus 4-1 into the memory with a certain timing delay after receiving the above signal to put out the data to the memory bus 4-1.

Figure 1:
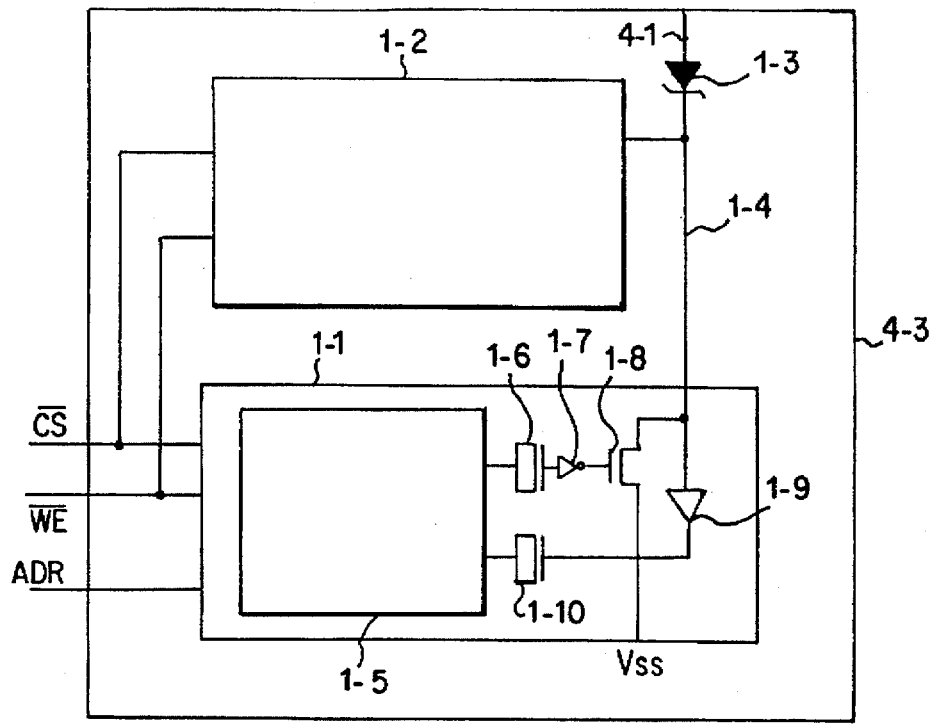
FIG. 1 is a circuit diagram showing a first embodiment of a load reducing circuit and a synchronous DRAM in accordance with the present invention.

A first embodiment of the invention will be described referring to FIG. 1 to FIG. 7. FIG. 1 shows a construction of a synchronous DRAM having a load reducing circuit (together identified by reference 4-3 in FIG. 4). A synchronous DRAM 1-1 and associated load reducing circuit 1-2, 1-3 are shown in FIG. 1. The load reducing circuit includes a Schottky diode 1-3 and a voltage control circuit 1-2 for controlling the voltage of the wiring in the output terminal side of the Schottky diode 1-3. The memory bus 4-1 is connected to the voltage control circuit 1-2 and the synchronous DRAM 1-1 through the Schottky diode 1-3.

The memory bus 4-1 is connected to the voltage control circuit 1-2 and the synchronous DRAM 1-1 through the Schottky diode. The chip select signal CS and the write enable signal WE are connected to the voltage control circuit 1-2 and the synchronous DRAM 1-1, and the memory address signal ADR is input to the synchronous DRAM 1-1.

Next, the internal construction of the synchronous DRAM 1-1 will be briefly described. The synchronous DRAM 1-1 includes a memory cell 1-5 having a large capacity, a latch for storing data read out from the memory cell, a pre-buffer 1-7, and a NMOS output circuit 1-8 of open drain type. A receiver or input circuit 1-10 is provided with a latch for storing data to be written in the memory cell. As described above, although the embodiment is a case where the input/output circuit for the synchronous DRAM employs GTL (gunning transfer logic), the present invention may also be applied to a common input/output circuit of push-pull type.

Figure 2:
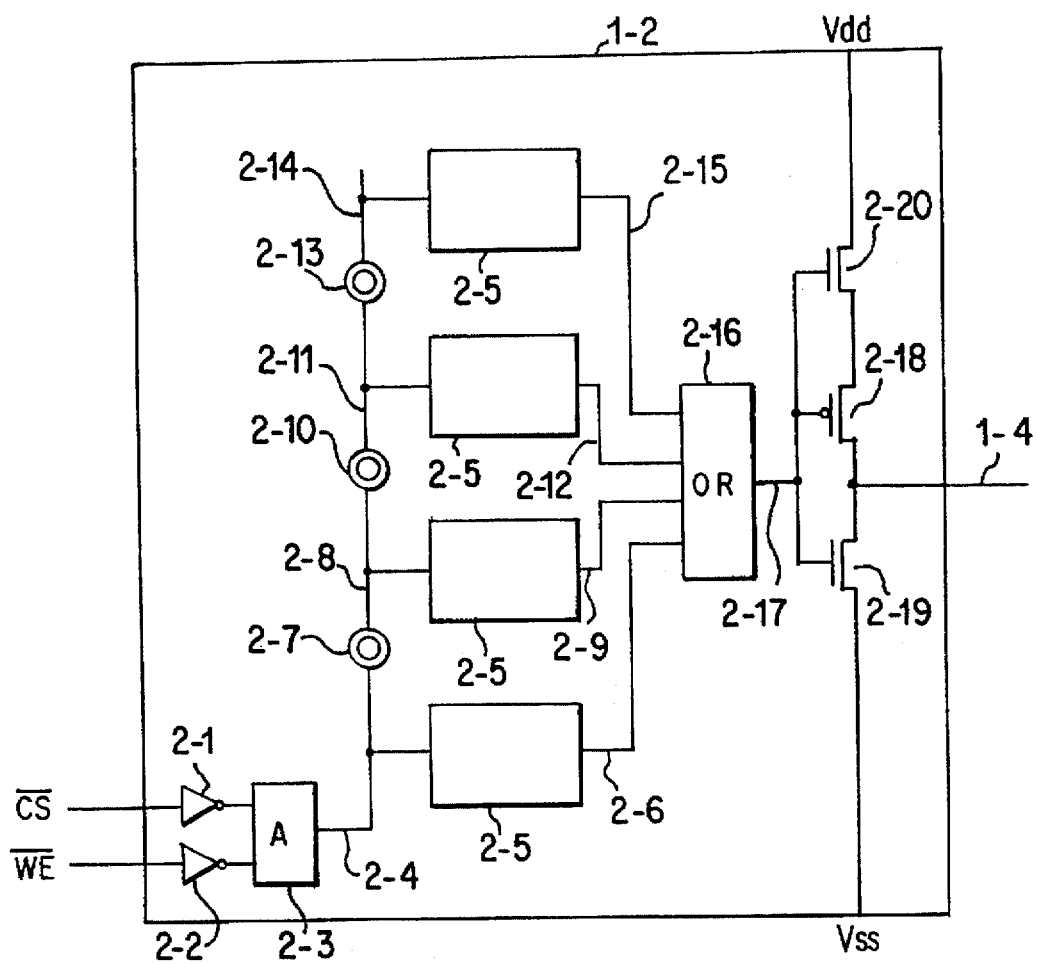
FIG. 2 is a circuit diagram showing a first embodiment of a voltage control circuit in a load reducing circuit in accordance with the present invention.

FIG. 2 is a construction diagram showing details of a voltage control circuit 1-2. An inverter 2-1 is provided for logically inverting the chip select signal CS, similarly an inverter 2-2 is provided for logically inverting the write enable signal WE. An AND circuit 2-3 has an output connected to a line 2-4.

Chopper circuits 2-5 with respective output lines 2-6 are connected to the line 2-4. The numerals 2-7, 2-10 and 2-13 depict flip-flops of edge trigger type, the flip-flop 2-10 putting out the signal on a line 2-8 to a line 2-11 in the following cycle, similarly the flip-flop 2-13 putting out the signal on a line 2-11 to a line 2-14 in the following cycle. The output signals from the chopper circuits each are input to an OR circuit 2-16 through signal lines 2-6, 2-9, 2-12 and 2-15, respectively. The numeral 2-17 is an output signal line of the OR circuit connected to gate parts of a PMOS 2-18 and an NMOS 2-19. Therewith, the voltage of the line in the output terminal side of the Schottky diode is controlled.

Figure 3:
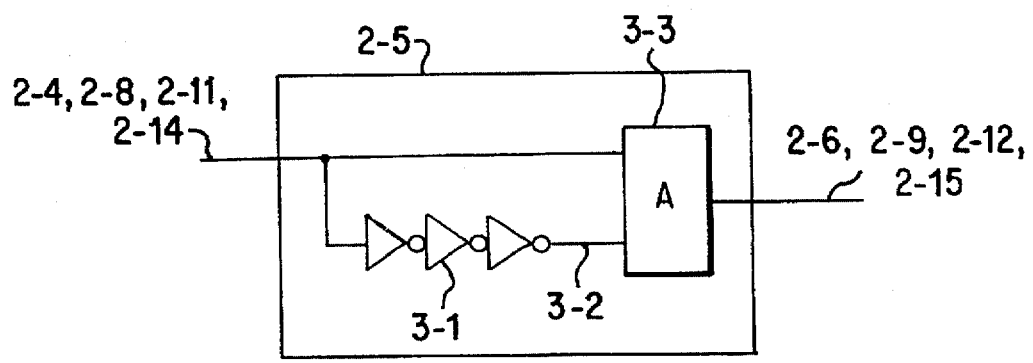
FIG. 3 is a circuit diagram showing a first embodiment of a chopper circuit in the load reducing circuit in accordance with the present invention.

Before describing the detailed operation, the construction of the chopper circuit 2-5 will be described, referring to FIG. 3. The numerals 3-1 are three inverters, which are circuits for delaying and for logically inverting signals. The numeral 3-3 puts out the AND result of signal lines 2-4, 2-8, 2-11, 2-14 to signal lines 2-6, 2-9, 2-12, 2-15.

Figure 5:
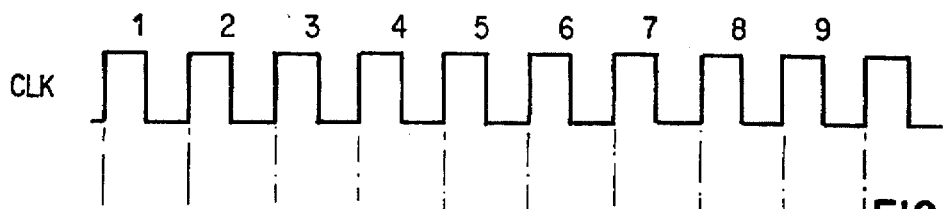
FIGS. 5-5F are timing charts of the voltage control circuit for a synchronous DRAM not chip-selected in the first embodiment in accordance with the present invention.
Figure 5A:
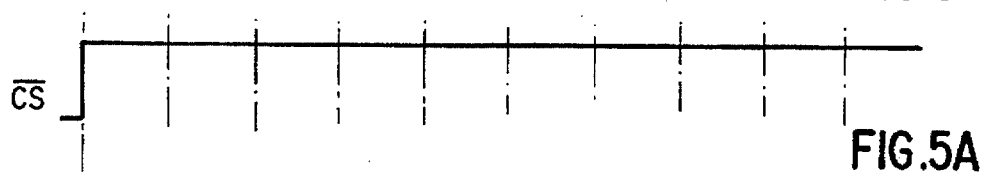
Figure 5B:
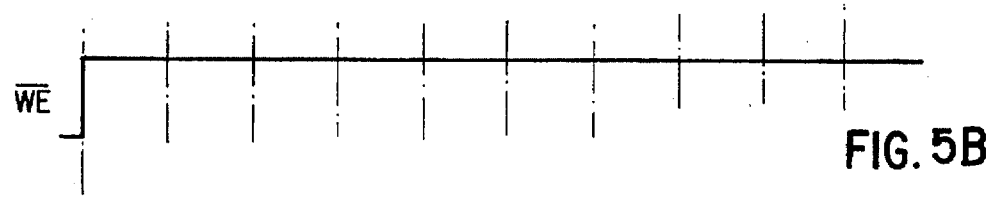
Figure 5C:
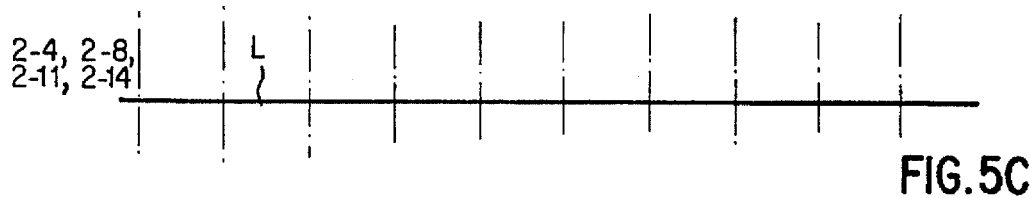
Figure 5D:
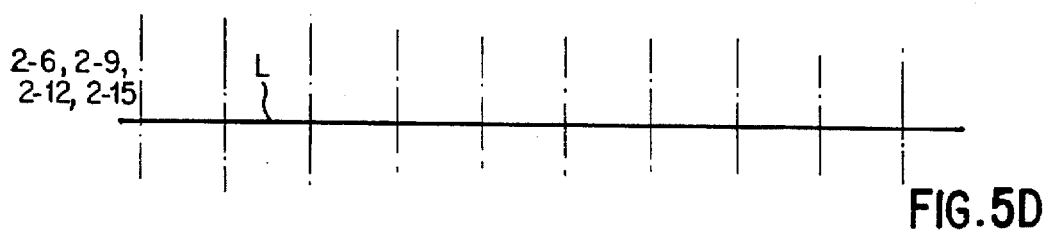
Figure 5E:
Figure 5F:
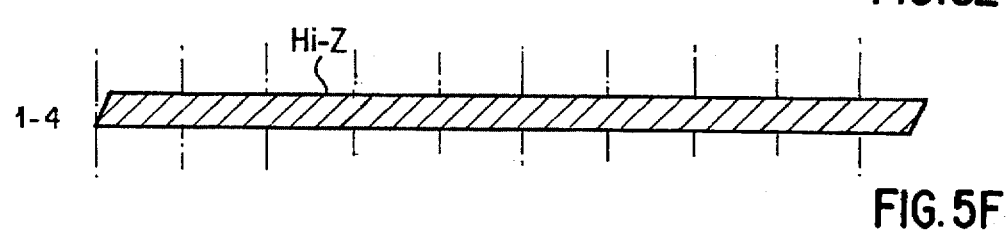

The operation of the circuit construction described above will be described below, referring to FIGS. 5–5F to FIGS. 7–7F. Firstly, the operation of the load reducing circuit in the synchronous DRAM not chip-selected will be described referring to FIGS. 5–5F. The symbol CLK is a clock given to the memory controller and the synchronous DRAM. It is assumed that the memory system is operated based on the clock. Both of the CS signal and the WE signal are in a high level (H) since they are not chip-selected. Therefore, the signal 2-4 in FIG. 2 is in a low level (L). And all of the signals 2-8, 2-10, 2-13 are in low level through the flip-flops of edge trigger type 2-7, 2-10, 2-13. As a result, the output signal 2-17 from an OR circuit 2-16 also is in low level (L) since all of the output signals 2-6, 2-9, 2-12, 2-15 from the chopper circuits 2-5 are in low level (L).

Since NMOS transistors 2-20 and 2-19 are in an OFF state and PMOS transistor 2-18 is in an ON state, a signal is not put out to the signal line 1-4 and the circuit is in a high impedance state. However, it can be understood from FIG. 1 that the signal line 1-4 is connected to the memory bus signal line 4-1 through the Schottky diode 1-3 and the memory bus signal line 4-1 is connected to the voltage Vtt through the end terminal resistance 4-2. Therefore, when the semiconductor memory or the memory controller does not drive the memory bus, the memory bus signal line 4-1 becomes in high level and the signal line 1-4 also becomes in high level. Since a reverse bias voltage is applied to the Schottky diode once the signal line 1-4 becomes in high level, the load capacitance of the synchronous DRAM 1-1 is in a cut-off state from the memory bus signal line 4-1 and the resultant load capacitance becomes only the load capacitance of the Schottky diode itself. The load capacitance of the Schottky diode at a reverse bias voltage applying state is very small and approximately 1 pF from its characteristic.

The operation when data is read out from the synchronous DRAM will be described, referring to FIGS. 6–6H. Because of a case of memory read, according to the specification of the synchronous DRAM, the chip select signal CS becomes in low level at the cycles of clock 1 and clock 3 and the write enable signal WE becomes in high level. The address signal ADR is given to the synchronous DRAM synchronizing with the chip select signal. In this example, four signals of read data RD0, RD1, RD2, RD3 are sequentially put out to the memory bus signal line starting from the cycle of clock 6. The operation of the voltage controlling circuit in FIG. 2 at this moment will be described below.

The signal lines 2-4, 2-8, 2-11, 2-14 are obviously in low level, and consequently the signal line 2-6 becomes in low level and the signal line 1-4 is in a high impedance state. However, since the synchronous DRAM drives the signal line 1-4 from the output driver 1-8 in FIG. 1 in the period of clock 6 to clock 9, the output signals RD0, RD1, RD2, RD3 are consequently put out to the memory bus signal line 4-1 through the Schottky diode 1-3. As described above, the load reducing circuit controls the signal line 1-4 in the high impedance state during memory read.

Figure 7:
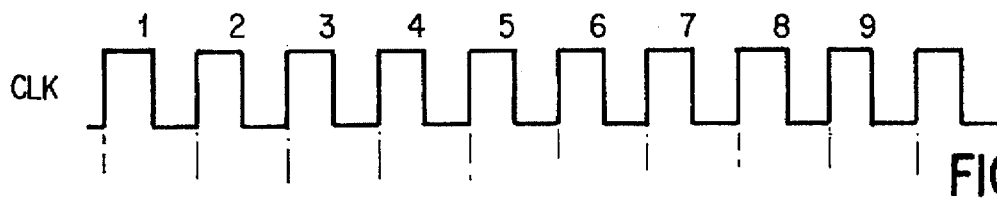
FIGS. 7-7F are timing charts of the voltage control circuit for memory write in the first embodiment in accordance with the present invention.
Figure 7A:
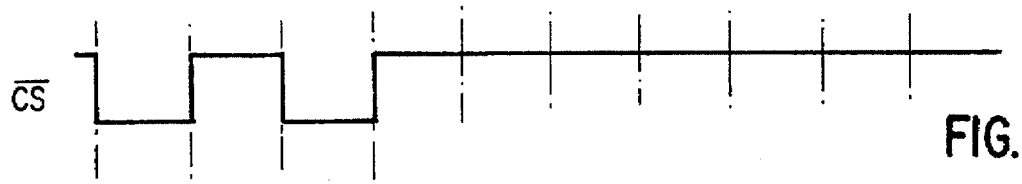
Figure 7B:
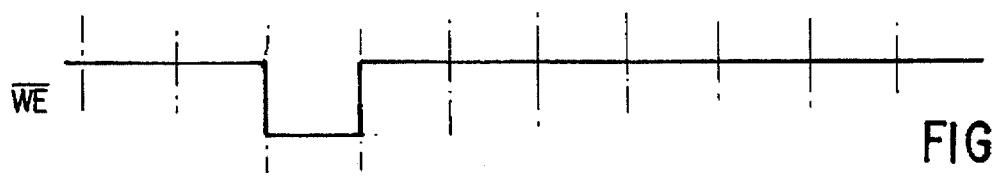
Figure 7C:
Figure 7D:
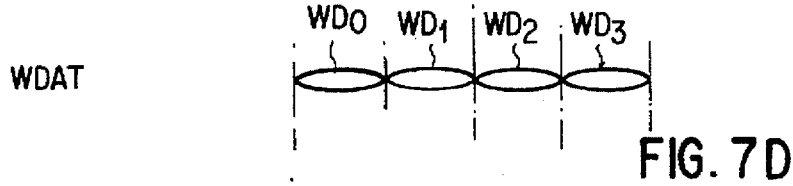
Figure 7E:
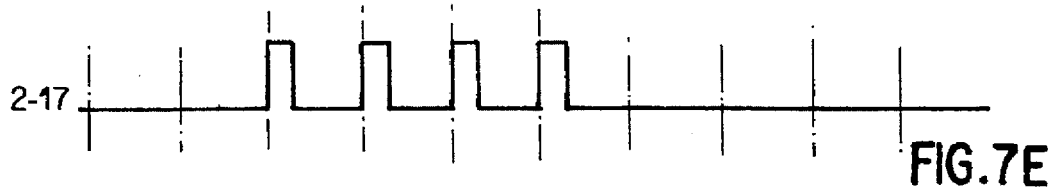
Figure 7F:
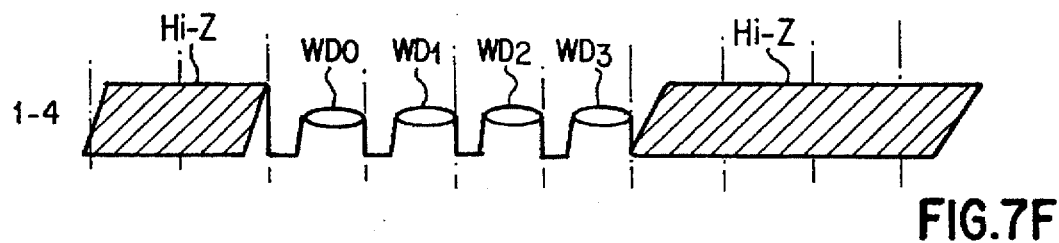

The operation when data is written into the synchronous DRAM will be described below, referring to FIGS. 7-7F. According to the specification of the synchronous DRAM, the chip select signal CS becomes in low level at the cycles of clock 1 and clock 3 and the write enable signal WE becomes in low level at the cycle of clock 3. The address signal ADR is given to the synchronous DRAM synchronizing with the chip select signal. Four signals of write data WD0, WD1, WD2, WD3 are sequentially put out to the memory bus signal line starting from the cycle of clock 3 to clock 6. The operation of the voltage control circuit until writing the write data on the memory bus signal line into the synchronous DRAM will be described below, referring to FIG. 2.

The signal line 2-4 becomes in high level only in the cycle of clock 3, since the signal is a result of logical AND of the logical inverted value of the chip select signal CS and the logical inverted value of the write enable signal WE. The output signals from the flip-flops of edge trigger type 2-8, 2-11, 2-14 becomes in high level delaying with respect to each other by the cycle of one clock. The signal line 2-17 for logical OR of signal lines 2-6, 2-9, 2-12, 2-15 has narrow pulse signals shown in FIG. 7-7F since the numeral 2-5 is a chopper circuit. The result is then that the signal line 1-4 becomes in low level since the NMOS transistors 2-20 and 2-19 turn to ON state only when the narrow and high level pulse is applied to their gate parts and the PMOS transistor 2-18 turns to OFF state. In this moment, a write data on the memory bus signal line 4-1 enters into the signal line 1-4 through the Schottky diode 1-3 which is then forward or normally biased. Then when the signal on the signal line 1-4 is not output after the narrow pulses, the signal line 1-4 is in a high impedance state and the voltage at that time is held since the NMOS transistors 2-20 and 2-19 turn to OFF state. The result is that the synchronous DRAM can write the data WD0, WD1, WD2, WD3 in the memory cell 1-5 through the input circuit 1-9.

As described above, in the embodiment of FIGS. 1-7, the load capacitance of the synchronous DRAM can be separated from the memory bus. This enables substantial improvement in the operating frequency of the memory bus and overall memory system.

A second embodiment will be described below, referring to FIG. 8 to FIG. 11.

Figure 8:
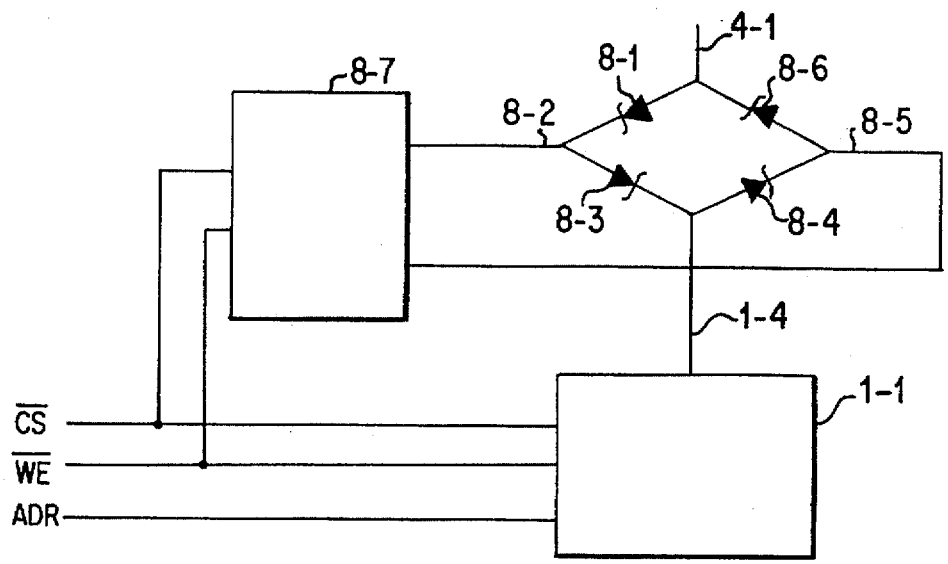
FIG. 8 is a circuit diagram showing a second embodiment of a load reducing circuit and a synchronous DRAM in accordance with the present invention.

FIG. 8 shows the construction of a load reducing circuit (8-1 to 8-7) and a synchronous DRAM 1-1. The load reducing circuit (8-1 to 8-7) in FIG. 8 is different from the load reducing circuit (1-2, 1-3) in FIG. 1. In the load reducing circuit in FIG. 8, by arranging four Schottky diodes (8-1, 8-3, 8-4, 8-6) to form a circle, the load capacitance of the synchronous DRAM 1-1 is separated from the memory bus 4-1 with the voltage control circuit 8-7 and the signal lines 8-2, 8-5. The operation of the load reducing circuit will be described below.

The voltage control circuit 8-7 controls the signal line 8-2 and the signal line 8-5 into high impedance states in the period of reading memory from the synchronous DRAM and in the period of writing memory to the synchronous DRAM.

The operation in the period of reading memory will be described first. When the synchronous DRAM puts out a low level voltage to the signal line 1-4, the Schottky diode 8-3 turns to ON state and the signal line 8-2 becomes in low level. Consequently, the memory bus signal line 4-1 becomes in low level since the Schottky diode 8-1 also turns to ON state. And the Schottky diodes 8-6 and 8-5 also turn to ON state to bring all the signal lines in low level. Next, when the synchronous DRAM puts out a high level voltage to the signal line 1-4, the signal line 8-5 becomes in high level. The reason is that if the earlier state of the signal line is in low level, the Schottky diode 8-4 turns to ON state and consequently the signal line 8-5 becomes in high level. Since all the signal lines become in high level with the same operation principle, the signal line 4-1 becomes in high level.

The operation in the period of writing memory will be described next. When the memory bus signal line is in low level, the Schottky diode 8-6 turns to ON state and the signal line 8-5 becomes in low level. Since all the signal lines become in low level with the same operation principle, the signal line 4-1 becomes in low level. As a result low level voltage can be written in the memory cell 1-5 in the synchronous DRAM 1-1. Next, when the memory bus signal line 4-1 is in high level, the signal line 8-2 becomes in high level through the Schottky diode 8-1. The reason is that even if the earlier state of the signal line is in low level, the Schottky diode 8-1 turns to ON state and consequently the signal line 8-2 becomes in high level. The signal line 1-4 also becomes in high level for the same reason, and high level voltage can be written in the memory cell 1-5 in the synchronous DRAM.

The voltage control circuit 8-7 controls the synchronous DRAM not chip-selected such as to bring the signal line 8-2 in high level and the signal line 8-5 in low level.

In this case, the object of the load reducing circuit is to separate the load capacitance of the synchronous DRAM from the memory bus 4-1. The operation will be described below. If the memory bus 4-1 is in high level, the Schottky diode 8-1 is in OFF state since the signal line 8-2 is in high level. On the other hand, since the Schottky diode 8-6 also turns to OFF state, the load capacitance of the synchronous DRAM is completely separated from the memory bus 4-1. Next, when the memory bus 4-1 is in low level, the Schottky diode 8-1 is in OFF state since the signal line 8-2 is in high level. On the other hand, the Schottky diode 8-6 does not turn to ON state since the signal line 8-5 is in low level. As a result, the load capacitance of the synchronous DRAM is completely separated from the memory bus 4-1.

Figure 9:
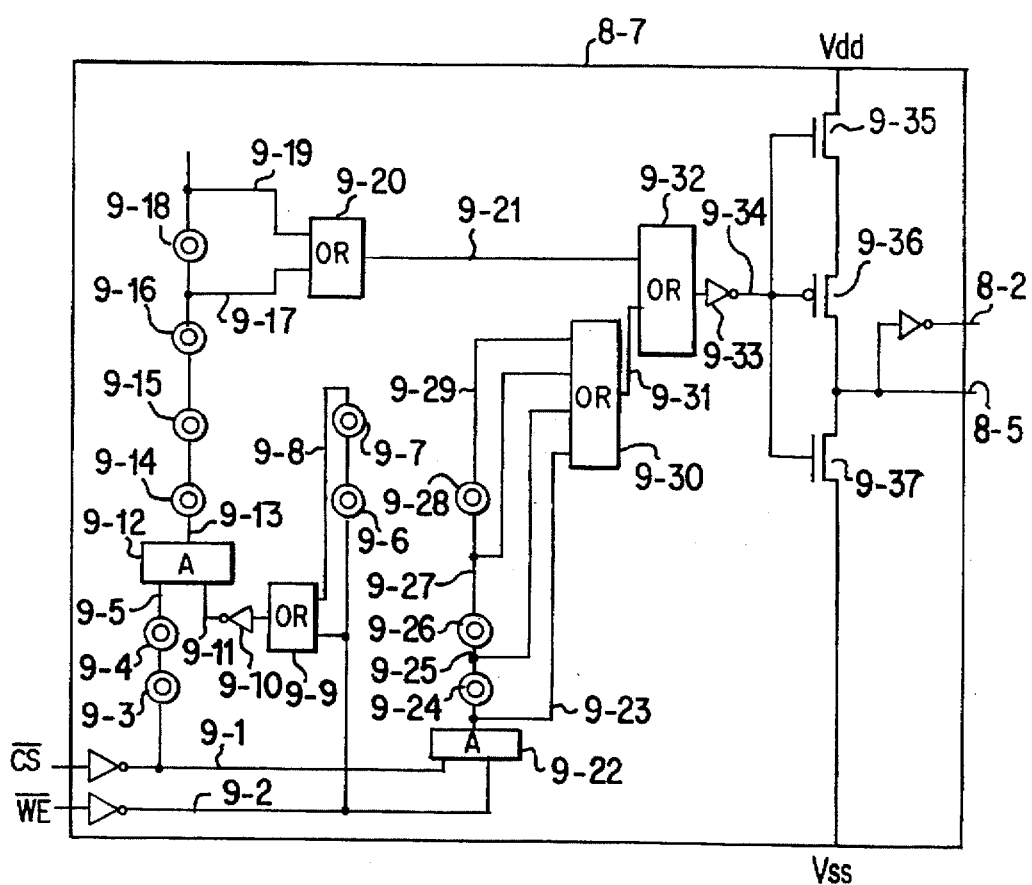
FIG. 9 is a circuit diagram showing a second embodiment of a voltage control circuit in the load reducing circuit in accordance with the present invention.

The construction of the voltage control circuit 8-7 will be described below, referring to FIG. 9. The circuit controls the signal lines 8-2 and 8-5 such as to bring both lines to a high impedance state in the periods of memory read and memory write, and bring the signal line 8-2 to high level and the signal line 8-5 to low level in the period of not chip-selecting.

Parts 9-3 to 9-21 of the control circuit are used in the period of memory read and the parts 9-22 to 9-31 of the control circuit are used in the period of memory write. A signal line 9-1 is provided for logical inverted chip select signal CS, and a signal line 9-2 is provided for logically inverted write enable signal WE. Flip flops 9-3, 9-4, 9-6, 9-7, 9-14, 9-15, 9-16, 9-18 of edge trigger type are also provided as shown. Further provided are OR circuits 9-9 and 9-20, an AND circuit 9-12 and an inverter 9-10. An AND circuit 9-22, flip-flops 9-24, 9-26, 9-28 of edge trigger type, OR circuits 9-30 and 9-32 and an inverter 9-33 are also provided as shown. The numerals 9-35 and 9-37 depict NMOS transistors and the numeral 9-36 depicts a PMOS transistor.

The operation of the voltage control circuit in FIG. 9 will be described below in detail, referring to a memory read timing chart shown in FIGS. 10–10K and a memory write timing chart shown in FIGS. 11–11N.

Firstly, the memory read timing chart in FIGS. 10–10K will be described. The symbol CLK is a clock, and the chip select signal CS becomes in low level in cycle 1 and cycle 4 of the clock according to the specification of the synchronous DRAM. Since it is a case of memory read, the write enable signal WE is in high level. The memory address signal ADR is put out as RAS and CAS in the same cycle as the chip select signal CAS to the memory bus 4-1 from the memory controller. Since the signal line 9-1 becomes in high level in cycles 1 and cycle 3 of the clock, the voltage control circuit 8-7 controls the signal line 9-5 to become in high level with two cycle behind. The signal line 9-11 is in high level. As a result, the output signal line 9-13 of the AND circuit has the same timing as the signal line 9-5. The signal line 9-17 turns to high level 3 cycles behind the signal line 9-13, the signal line 9-19 turning to high level 4 cycles behind the signal line 9-13. Therefore, the signal 9-21 which is a logical OR of the signal lines 9-17 and 9-19 is in high level in the period from cycle 6 to cycle 9 of the clock. On the other hand, since the signal line 9-2 is kept in low level, the signal line 9-13 is also in low level. As a result of the above, the signal line 9-34 for logically inverted value of logical OR of signals 9-21 and 9-31 is in high level in the period from 1 to 5 cycle of the clock and in low level in the period from 6 to 9 cycle of the clock, and in high level after then. Therefore, since the NMOS transistors 9-35 and 9-37 are in ON state in the period from 1 to 5 cycle of the clock, the signal line 8-5 is controlled in low level and the signal line 8-2 is controlled in high level as the result. Further, the signal lines 8-5 and 8-2 are controlled in the high impedance state since the signal lines are in OFF state in the period from cycle 6 to cycle 9 of the clock. The result is that the signal lines 8-5 and 8-2 are controlled in the high impedance state in the period from cycle 6 to cycle 9 of the clock while the read data RDO, RD1, RD2, RD3 are being put out to the memory bus.

Finally, the memory write timing chart in FIGS. 11–11N will be described. The symbol CLK is a clock, and the chip select signal CS becomes in low level in cycle 1 and cycle 4 of the clock according to the specification of the synchronous DRAM. Since it is a case of memory write, the write enable signal WE is in low level in cycle 3 of the clock. The memory address signal ADR is put out as RAS and CAS in the same cycle as the write enabling signal WE to the memory bus 4-1 from the memory controller. Since the signal line 9-1 becomes in high level in cycles 1 and cycle 3 of the clock, the voltage control circuit 8-7 controls the signal line 9-5 to become in high level with two cycles behind. However, the signal line 9-11 turns to low level on the contrary. Therefore, the output signal line 9-12 of the AND circuit becomes in low level. As a result, the signal line 9-21 also becomes in low level.

On the other hand, the signal line 9-23 becomes in high level since the signal line is the output signal line of the AND circuit 9-22. Similarly, the signal lines 9-25, 9-27, 9-29 become in high level with 1 cycle behind. As a result, the output signal line 9-31 of the OR circuit 9-30 is in low level in the period from cycle 3 to cycle 6 of the clock and in high level in the other cycles of the clock.

As the result of the above, the signal line 9-34 for logically inverted value of logical OR of signals 9-21 and 9-31, is in high level in the period from cycle 1 to cycle 2 of the clock and in low level in the period from cycle 3 to cycle 6 of the clock, and in high level after then. Therefore, since the NMOS transistors 9-35 and 9-37 are in ON state in the period from cycle 1 to cycle 2 of the clock, the signal line 8-5 is controlled in low level and the signal line 8-2 is controlled in high level as the result. Further, the signal lines 8-5 and 8-2 are controlled in the high impedance state since the signal lines are in OFF state in the period from cycle 3 to cycle 6 of the clock. The result is that the signal lines 8-5 and 8-2 are controlled in the high impedance state in the period from cycle 3 to cycle 6 of the clock while the write data WD0, WD1, WD2, WD3 are being put out to the memory bus.

As described above, it can be understood that the memory system is capable of reading and writing memory, and separating the load capacitance of the synchronous DRAM from the memory bus when not chip-selected.

A third embodiment will be described below, referring to FIG. 12.

Figure 12:
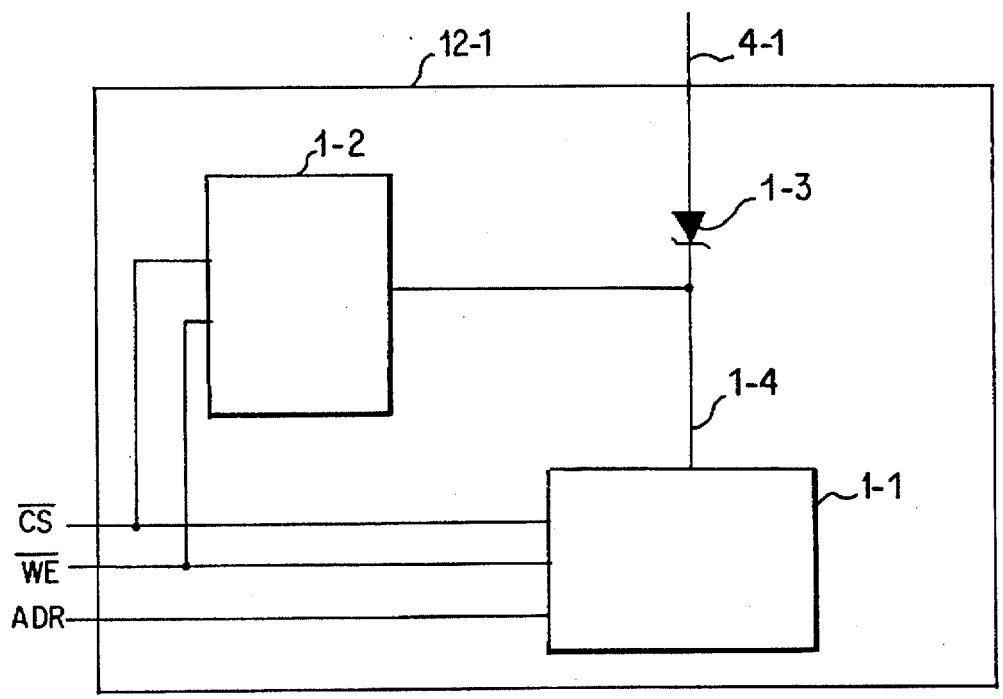
FIG. 12 is a circuit diagram showing a third embodiment of a DRAM containing a load reducing circuit in accordance with the present invention.

FIG. 12 shows the structure of a synchronous DRAM unit 12-1 containing a load reducing circuit 1-2, 1-3. It can be understood that the DRAM 1-1 having a memory cell contains a load reducing circuit. The detailed operation is omitted here since it is the same as that described above.

A fourth embodiment will be described below, referring to FIG. 13.

Figure 13:
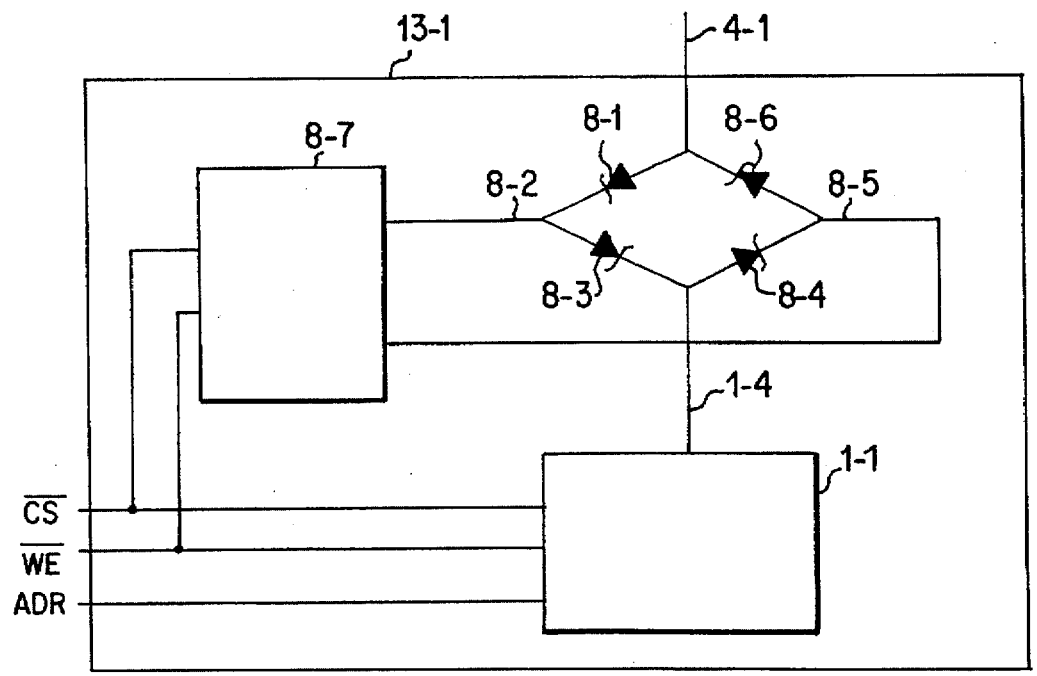
FIG. 13 is a circuit diagram showing a fourth embodiment of a DRAM containing a load reducing circuit in accordance with the present invention.

FIG. 13 shows the structure of a synchronous DRAM unit 13-1 containing a load reducing circuit 8-1 to 8-7. It can be understood that the DRAM 1-1 having a memory cell contains a load reducing circuit.

A fifth embodiment will be described below, referring to FIG. 14.

Figure 14:
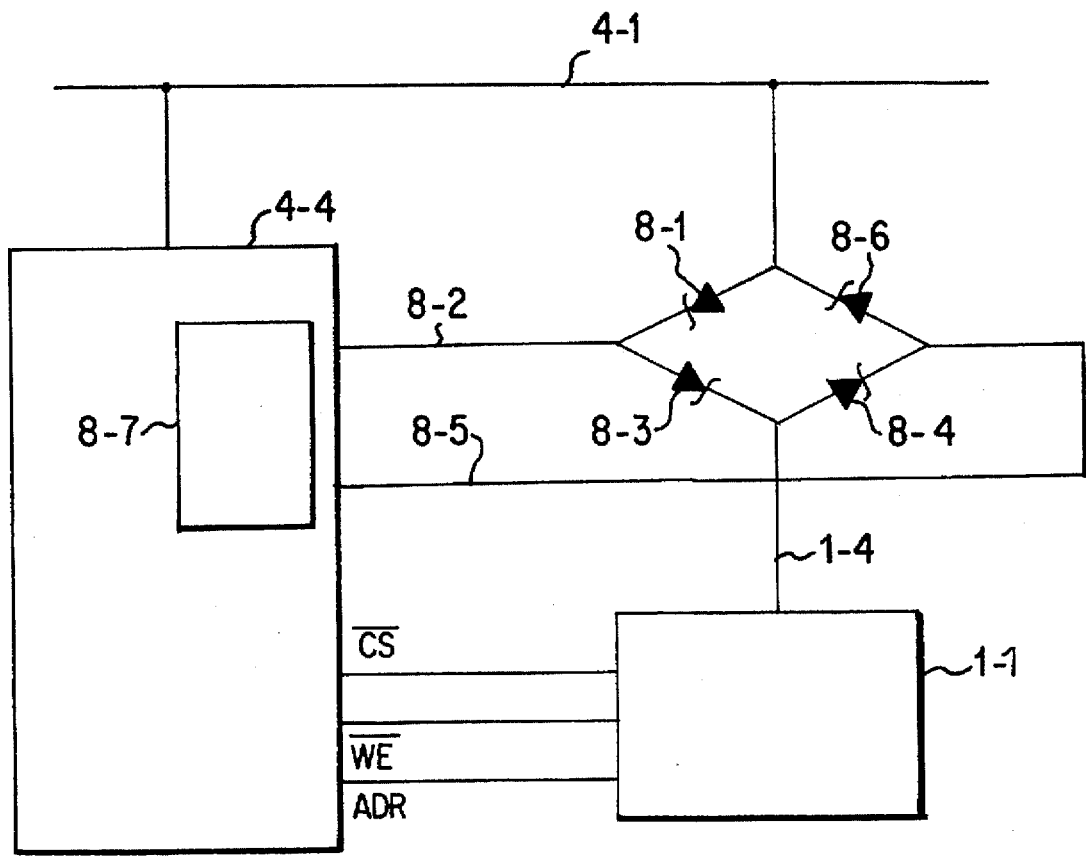
FIG. 14 is a circuit diagram showing a fifth embodiment of a memory controller containing a voltage control circuit in accordance with the present invention.

FIG. 14 shows the construction where the memory controller 4-4 contains the portion of the voltage control circuit 8-7 in the load reducing circuit, and Schottky diodes 8-1, 8-3, 8-4, 8-6 are arranged between the memory bus 4-1 and the synchronous DRAM 1-1. The detailed operation is omitted here since it is the same as that described above for the embodiment with four Schottky diodes.

Generally, in a memory system in a computer, even when a plurality of semiconductor memories are connected to a memory bus, only one semiconductor memory is accessible at a time. That is, data is written in or is read out from a semiconductor memory selected by a chip enable signal. This means that the semiconductor memories not selected by the chip enable signal are unnecessary memories and their load capacitances act as a dominant factor for decreasing the signal transmitting speed in the memory bus.

On the other hand, when a reverse bias voltage is applied to a Schottky diode, current does not flow in the normal direction and the Schottky diode is in an insulated state. In this moment, seeing the circuit from the side of memory bus, the load capacitance of the semiconductor cannot be seen and the load capacitance of the Schottky diode itself is seen. One of the important points here is that a Schottky diode has such a characteristic that when the reverse bias voltage is applied to a Schottky diode, the load capacitance of the Schottky diode becomes very small and approximately 1 pF.

By utilizing the special character of a memory bus and the characteristic of a Schottky diode as described above, load capacitance can be decreased. However, on the contrary, in a state where a reverse bias voltage is applied to a Schottky diode, the level voltage cannot pass through the Schottky diode whether the voltage on the bus line is in high level or in low level. Therefore, there arises a problem in that a signal cannot be transmitted to the semiconductor memory. For this reason, in the present invention, both the chip select signal and the write enable signal turn to ON state, the voltage control circuit controls such that the voltage in the bus side may pass through the Schottky diode by stopping to apply the reverse bias voltage to the Schottky diode and by grounding the Schottky diode for a moment. By doing so, data can be written in the semiconductor memory.

As described above, applying a reverse bias voltage to a Schottky diode acts function to separate the load capacitance of a semiconductor memory connected to a bus from the bus. Therefore, delay in signal transmitting speed due to the load capacitance connected to the bus can be eliminated and the reflection from the semiconductor memory can be decreased.

The voltage control circuit has a function to separate the load capacitance of all of the semiconductor memories not chip-selected from the bus by applying a reverse bias voltage to the Schottky diodes associated with the semiconductor memories not chip-selected as described above. And when data is read from the semiconductor memory chip-selected, the voltage control circuit turns to a high impedance state. If the read data is in low level, the voltage on the bus line is at a low level since the voltage applies to the Schottky diode in the normal or forward bias voltage direction. If the read data is in high level, the read data cannot pass through the Schottky diode since the reverse bias voltage is applied but the voltage on the bus line is turned to high level by a power source at end terminal through the end terminal resistance since there is no semiconductor memory to drive the bus. On the other hand, when data is written in the semiconductor memory chip-selected, the voltage control circuit grounds the Schottky diode for a moment such that the voltage in the normal direction can be temporarily applied to the Schottky diode and then brings the Schottky diode in the high impedance state. With the result that the voltage on the bus line passes through the Schottky diode and the voltage level can be transmitted to the semiconductor memory.

As described above, according to the present invention, the load capacitance of semiconductor memory connected to a memory bus line can be separated from the memory bus side. As the result, the speed of signal transmission does not decrease even when a large number of semiconductor memories are connected to the memory bus since the load capacitance can be cut off from the memory bus.

Preferred embodiments of the invention are contemplated where load reducing circuits as described herein are used to isolate a group of memories from the bus line, rather than only a single memory. If any of a group of memories are to be operable then the group would not be isolated by the load reducing circuit containing one or more Schottky diodes. An advantage of such a system would be a reduction in the costs for the load reducing circuit components, including Schottky diodes. If there were 10 groups of 10 memories each, 9 groups or 90% of the memories would be isolated from the bus line at any given time when a single memory is selected to be accessed. Since only 10 load reducing circuits are required as compared to 100 if each memory were provided with a load reducing circuit, 90% of the effective reduction in load is obtained with approximately 10% of the expenditure for load reducing circuit. By having load reducing circuits for each pair of memories, the component costs could be halved while obtaining about 98% of the load reduction advantage of the invention.

Embodiments of the invention are contemplated with memory systems having large numbers, including up to 200 and more memories on a bus line.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A computer memory system comprising:
    a plurality of separate memory units,
    a memory bus connected with the memory units,
    a memory controller having memory unit select signal generating means for signalling selection of respective ones of the memory units and read and write signal transmitting means for transmitting memory read and write signals between respective selected memory units and the memory controller via the memory bus, and
    at least one memory bus capacitance load reducing circuit for selectively separating load capacitance of at least some of the memory units which are then not selected from the memory bus, having a voltage control circuit for releasing a reverse bias voltage applied to a diode connected between a respective memory unit and the memory bus when said respective memory unit is selected and is transmitted said read signal, said voltage control circuit applying a normal bias voltage to said diode and then releasing the normal bias voltage when said respective memory unit is selected and is transmitted said write signal.

2. A computer memory system according to claim 1, wherein a separate one of said voltage control circuits is disposed between each memory unit and the memory bus.

3. A computer memory system according to claim 1, wherein a plurality of groups of said memory units are provided and wherein a separate one of said voltage control circuits is disposed between each group of memory units and the memory bus.

4. A computer memory system according to claim 1, wherein each of said diodes is a Schottky diode.

5. A computer memory system according to claim 2, wherein each of said diodes is a Schottky diode.

6. A computer memory system according to claim 3, wherein each of said diodes is a Schottky diode.

7. A computer memory system according to claim 4, wherein each of said voltage control circuits includes only a single Schottky diode.

8. A computer memory system according to claim 5, wherein each of said voltage control circuits includes only a single Schottky diode.

9. A computer memory system according to claim 6, wherein each of said voltage control circuits includes only a single Schottky diode.

10. A computer memory system according to claim 4, wherein each of said voltage control circuits includes a plurality of Schottky diodes.

11. A computer memory system according to claim 5, wherein each of said voltage control circuits includes a plurality of Schottky diodes.

12. A computer memory system according to claim 6, wherein each of said voltage control circuits includes a plurality of Schottky diodes.

13. A computer memory system according to claim 10, wherein each of said voltage control circuits includes four Schottky diodes.

14. A computer memory system according to claim 11, wherein each of said voltage control circuits includes four Schottky diodes.

15. A computer memory system according to claim 12, wherein each of said voltage control circuits includes four Schottky diodes.

16. A memory system having a semiconductor memory containing a signal input/output circuit, bus wiring terminated at at least one of its ends with a voltage, wherein said semiconductor memory is connected to said bus wiring through a load reducing circuit for separating load capacitance of said signal input/output circuit from said bus wiring, wherein said semiconductor memory receives a chip select signal and a write enable signal, said load reducing circuit being composed of a Schottky diode and a voltage control circuit, the Schottky diode having an input terminal connected to the bus wiring and an output terminal connected to the semiconductor memory and the voltage control circuit, the voltage control circuit receiving the chip select signal and the write enable signal to control the voltage of an output side terminal of the voltage control circuit, wherein said voltage control circuit:

applies a reverse bias voltage to the output terminal of the Schottky diode when the chip select signal is in an OFF state, temporarily grounds the voltage at the output terminal of the Schottky diode to transmit the voltage of the bus wiring to said semiconductor memory when the chip select signal is in an ON state and the write enable signal is in an ON state, and controls an impedance of the voltage control circuit in a high impedance state when the chip select signal is in the ON state and the write enable signal is in the OFF state.

17. A memory system having a semiconductor memory containing a signal input/output circuit, bus wiring terminated at at least one of its ends with a voltage, wherein said semiconductor memory is connected to said bus wiring through a load reducing circuit for separating load capacitance of said signal input/output circuit from said bus wiring, wherein said semiconductor memory has a chip select signal and a write enable signal, said load reducing circuit being composed of a voltage control circuit and four or more Schottky diodes, the Schottky diodes being arranged to form a circle having a first terminal connected to the bus writing, a second terminal connected to the semiconductor memory and third and fourth terminals connected to said voltage control circuit, the voltage control circuit receiving the chip select signal to control the voltage of a terminal in the output side of the voltage control circuit to allow signals to pass from the bus wiring to the semiconductor memory; and wherein said voltage control circuit applies a reverse bias voltage to said Schottky diodes by applying a high level voltage and a low level voltage to the third and the fourth terminals, respectively, to separate the load capacitance of the semiconductor memory from memory bus wiring when the chip select signal is in OFF state, controlling such as to enable to transmit a signal between the memory wiring and the semiconductor memory by controlling the third and fourth terminals in high impedance states to turn said Schottky diodes to ON state when the chip select signal is in ON state.

18. A computer memory system comprising:

a plurality of separate memory units, a memory bus connected with the memory units, a memory controller which outputs memory selection and read or write signals to respective ones of the memory units, at least one diode connected between a respective memory unit and said memory bus, and a voltage control circuit which maintains a reverse bias voltage of said at least one diode when the memory selection signal is in an OFF state, releases said reverse bias voltage so as to maintain a high impedance state during a read operation of a selected memory unit, and momentarily applies a forward bias voltage to said at least one diode, which forward bias voltage is then released during a single clock cycle, when the memory selection and write signals are in an ON state.

19. A computer memory system, comprising:

a plurality of memory units, a memory bus coupled with said memory units, at least one diode connected between a respective memory unit and said memory bus, a voltage control circuit having an output terminal coupled between said at least one diode and a respective memory unit, said voltage control circuit maintaining a high level voltage at its output when the memory unit is not selected for read or write operations, wherein said voltage control circuit provides no voltage so as to maintain a high impedance at the output terminal during read operations of said respective memory unit, and momentarily provides a low level voltage at its output followed by no voltage to pass write data from said memory bus through said at least one diode to said respective memory unit during write operations.

* * * * *